US012620445B2

(12) United States Patent
Lu

(10) Patent No.: US 12,620,445 B2
(45) Date of Patent: May 5, 2026

(54) CONTROLLING ERASE-TO-PROGRAM DELAY FOR IMPROVING DATA RETENTION

(71) Applicant: MICRON TECHNOLOGY, INC., Boise, ID (US)

(72) Inventor: Zhongyuan Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 18/517,541

(22) Filed: Nov. 22, 2023

(65) Prior Publication Data

US 2024/0242768 A1 Jul. 18, 2024

Related U.S. Application Data

(60) Provisional application No. 63/438,570, filed on Jan. 12, 2023.

(51) Int. Cl.
| | |
|---|---|
| *G11C 16/16* | (2006.01) |
| *G11C 13/00* | (2006.01) |
| *G11C 16/08* | (2006.01) |
| *G11C 16/10* | (2006.01) |
| *G11C 16/34* | (2006.01) |
| *G11C 29/50* | (2006.01) |

(52) U.S. Cl.
CPC .......... *G11C 16/16* (2013.01); *G11C 13/0035* (2013.01); *G11C 16/08* (2013.01); *G11C 16/102* (2013.01); *G11C 16/34* (2013.01);

*G11C 16/349* (2013.01); *G11C 16/3495* (2013.01); *G11C 29/50004* (2013.01); *G11C 29/50016* (2013.01)

(58) Field of Classification Search
CPC ..... G11C 16/16; G11C 13/0035; G11C 16/08; G11C 16/102; G11C 16/34; G11C 16/349; G11C 16/3495; G11C 29/50004; G11C 29/50016; G11C 16/0483; G11C 16/10

See application file for complete search history.

(56) References Cited

U.S. PATENT DOCUMENTS

| | | | | |
|---|---|---|---|---|
| 9,799,405 | B1 * | 10/2017 | Micheloni | G11C 16/28 |
| 2020/0264944 | A1 * | 8/2020 | Mehta | G11C 16/26 |
| 2022/0101926 | A1 * | 3/2022 | Oowada | G11C 16/16 |
| 2022/0383956 | A1 * | 12/2022 | Yang | G11C 16/30 |

* cited by examiner

*Primary Examiner* — Donald HB Braswell
(74) *Attorney, Agent, or Firm* — Lowenstein Sandler LLP

(57) ABSTRACT

A memory device includes a memory array and control logic, operatively coupled to the memory array, to perform operations including identifying an erased block of the memory array, causing a set of cells addressable by a target wordline of the erased block to be set to a target threshold voltage, determining an amount of threshold voltage shift with respect to the target threshold voltage after a delay, determining whether the amount of threshold voltage shift satisfies a threshold condition defined by a target data retention metric, and in response to determining that the amount of threshold voltage shift is sufficient, releasing the erased block for programming.

20 Claims, 9 Drawing Sheets

200C

204₁

204₆

238

215₀

215₁

202₇

202₆

202₅

202₄

202₃

202₂

202₁

202₀

214

216

238ₙ

CONTROLLING ERASE-TO-PROGRAM DELAY FOR IMPROVING DATA RETENTION

CROSS-REFERENCE TO RELATED APPLICATION(S)

The present application claims the benefit of U.S. Provisional Patent Application No. 63/438,570, filed on Jan. 12, 2023 and entitled "CONTROLLING ERASE-TO-PROGRAM DELAY FOR IMPROVING DATA RETENTION", the entire contents of which are hereby incorporated by reference herein.

TECHNICAL FIELD

Embodiments of the disclosure relate generally to memory sub-systems, and more specifically, relate to controlling erase-to-program delay for data retention to enhance performance and reliability.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
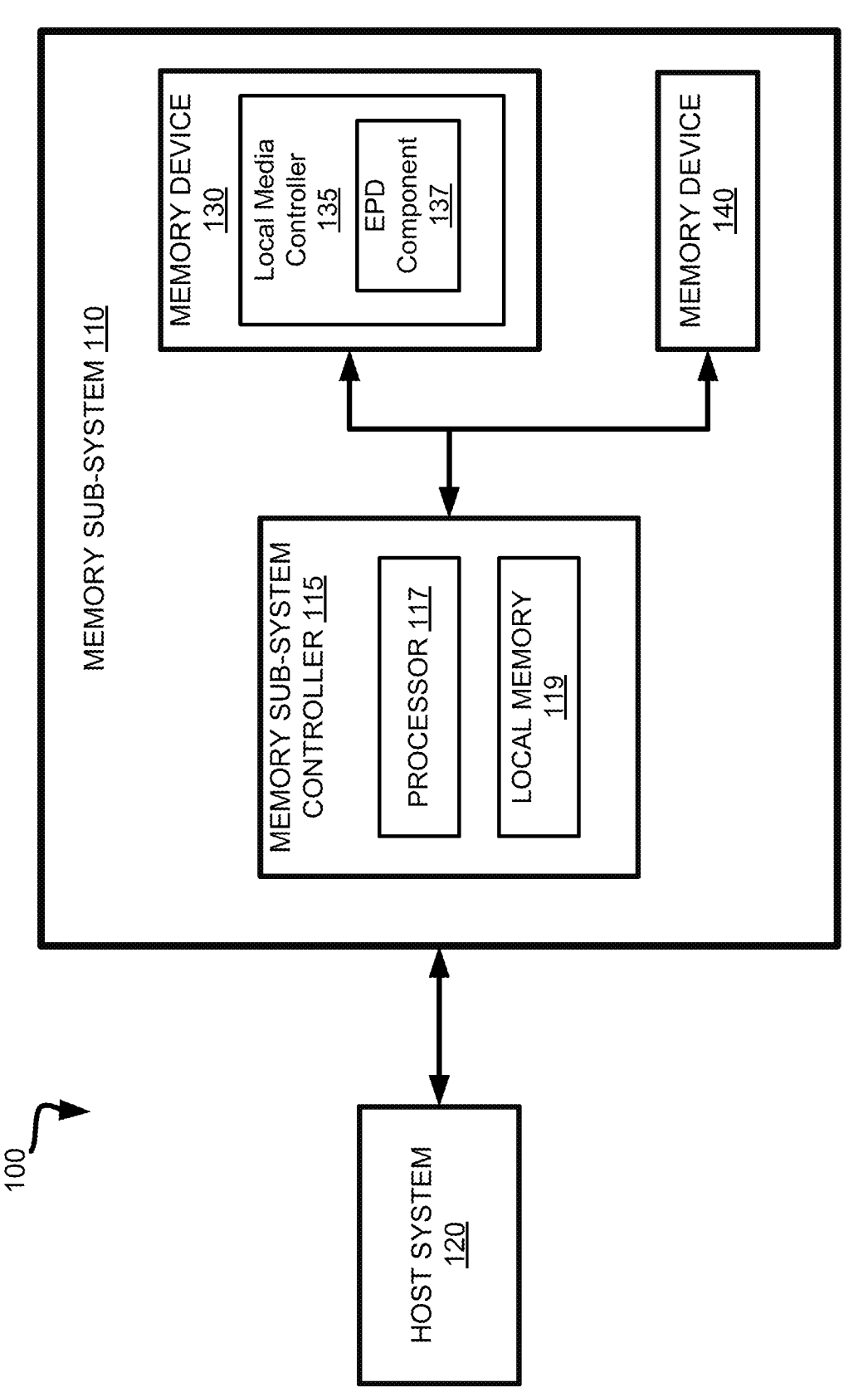
FIG. 1A illustrates an example computing system that includes a memory sub-system in accordance with some embodiments of the present disclosure.

Aspects of the present disclosure are directed to controlling erase-to-program delay for improving data retention. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1A. A non-volatile memory device is a package of one or more dies. Each die can include one or more planes. For some types of non-volatile memory devices (e.g., NAND devices), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

A memory device can be arranged in a two-dimensional or a three-dimensional grid. Memory cells are formed onto a silicon wafer in an array of A wordline can have a row of associated memory cells in a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. A block of data can correspond to one or more data addresses in the memory device (e.g., a block, a plurality of blocks, a plurality of cells, etc.). The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a block of data can result in read operations performed on two or more of the memory planes of the memory device.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell between a source electrode and a drain electrode. More specifically, for each individual cell (having a charge Q stored thereon) there can be a threshold control voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q, V_T)=dW/dVT$, where dW represents the probability that any given cell has its threshold voltage within the interval $[V_T, V_T+dV_T]$ when charge Q is placed on the cell.

A memory device can exhibit threshold voltage distributions $P(Q, VT)$ that are narrow compared with the working range of control voltages tolerated by the cells of the device. Accordingly, multiple non-overlapping $P(Q_k, V_T)$ ("valleys") can be fit into the working range allowing for storage and reliable detection of multiple values of the charge $Q_k$, $k=1, 2, 3 . . . .$. The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell can be larger than each of the 3 read windows for the MLC cell, and each of the 3 read windows for the MLC cell can be larger than each of the 7 read windows for the TLC cell etc. Read window budget (RWB) refers to the cumulative value of the read windows.

Data retention refers to the ability of a memory cell to retain its state over a period of time. Data retention can be affected by the operating temperature of the memory device, such that higher temperatures can degrade data retention by decreasing the amount of time that a cell can retain the data state (i.e., high temperature data retention (HTDR) loss). Data retention and/or data retention parameters (e.g., activation energy) can be empirically determined (e.g., estimated) by subjecting a memory device to a stress test. The stress test can involve a baking process, in which the memory device is exposed to a bake temperature for a bake time. The bake temperature is higher than a normal temperature of an environment in which the memory device is designed to operate (e.g., room temperature). Thus, the baking process can accelerate data retention loss. The results of the stress test can be used to estimate data retention at the normal temperature (e.g., an amount of time that a cell can be expected to retain data while in a normal temperature environment). Data retention can be analyzed using the results of the stress test. For example, an Arrhenius model for memory device reliability and data retention can be used to calculate a thermal acceleration factor for memory device time-to-failure as $A_T=\exp [(-E_a/k) (1/T_1-1/T_2)]$, where $A_T$ is the thermal acceleration factor due to temperature changes, $E_a$ is the activation energy (eV), k is Boltzmann's constant ($8.62 \times 10^{-5}$ eV/K), $T_1$ is the baking temperature (K) and $T_2$ is a system temperature (K).

As memory cell geometries become smaller and data is repeatedly programmed and erased in a memory device, such as a flash memory, the memory device can be more susceptible to errors due to various types of noise and disturb mechanisms within the memory cell, which can be exacerbated with repeated programming. As a result, the reliability of a block of a memory device and/or the memory device can decrease over time. Given this pattern, the end-of-life (EOL) reliability of the block and/or the memory device can be lower as compared to the beginning-of-life (BOL) reliability of the block and/or the memory device.

When there is an insufficient delay between erasing a block of a memory device and subsequently programming the block, residual holes can remain trapped in the semiconductor substrate. Subsequent programing of the block with the trapped residual holes can result in an inhibited threshold voltage across the block. The number of residual holes trapped in the semiconductor substrate can depend on a pre-erase data pattern and memory cell characteristic. As a result, some cells can have a larger upshift than other cells, making the threshold voltage distribution width wider, and thus decrease the available RWB. In some implementations, this effect has been compensated for by allowing time after and erase operation for the residual holes to de-trap before programming the block, and thus improve reliability of the block. However, some compensation methods (e.g., a delay between erasing a block and a subsequent block programming) can, in some circumstances (e.g., memory device BOL, EOL, etc.), reduce the reliability of the block.

During a program or erase operation on a non-volatile memory device, a selected block or cell can be programmed or erased by the application of a voltage to one or more selected wordline(s). Due to the wordline being common to multiple memory cells, unselected blocks or cells can be subject to the same programming voltage as the selected blocks or cells. If not otherwise preconditioned, the unselected blocks or cells can experience effects from the programming voltage on the common wordline. The programming voltage effects can include the condition of charge being stored in the unselected blocks or cells which are expected to maintain stored data. This programming voltage effect is termed "program disturb." Although a block or cell affected by program disturb is readable, the contents of the block or cell can be read as a data value different than the intended data value stored before application of the programming voltage.

Some blocks can be designated to be erased before being programmed (e.g., a block storing data can be erased and then programmed with new data). During an erase operation, relatively high voltages can be applied to the wordline and/or channel. For example, some implementations of an erase operation can include applying an initial pulse to wordlines of the block to reset memory cells with a lower threshold voltage. During the erase operation, electrons can be removed, and holes can be injected into the selected wordline (e.g., holes can form in the channel or charge trap layer, allowing electrons to flow into the channel). For example, injected holes can be trapped in storage nitride of array transistors connected to the wordlines that have been erased. Since the channel region (e.g., the pillar) in some non-volitive memory devices is a floating channel that might not be connected to a bulk grounded body, it can take a certain amount of time before the residue holes are discharged. Accordingly, these holes can contribute to program disturb in a number of ways.

For example, programming a block may involve performing a program operation immediately following an erase operation, which can be referred to as zero-delay erase policy (where "zero-delay" refers to no programmed or pre-determined delay, not necessarily that there will be practically "zero delay" between an erase operation and subsequent program operation). One example of a zero-delay erase policy is an "erase on demand" (EOD) erase policy. However, performing the program operation immediately following the erase operation can cause residual holes to remain trapped during the programming process. Accordingly, the residual holes might not discharge until after the program operation is completed, and memory cells programmed to lower threshold voltages or logic states can experience the most programming disturbances. When the residual holes discharge during or after the program operation, a threshold voltage of memory cells can shift (e.g., the voltage threshold of the memory cells can increase after the residue holes are discharged). This can impact read margins and can cause the contents of the memory cell to be read as a data value different than the intended value stored during the application of the programming voltage. Moreover, zero-delay erase policies may not be beneficial for low latency applications as the program operation is performed in conjunction with the erase operation.

Alternatively, a non-zero delay erase policy may be implemented, during which an amount of time can be added between an erase operation and a subsequent program operation, referred to as an erase-to-program delay. Non-zero delay erase policies can be beneficial for low latency applications by enabling the program operation to be performed separately from the erase operation, instead of in conjunction with the erase operation. The erase-to-program delay can be configurable, programmed and/or pre-determined.

One example of a non-zero delay erase policy is a "just-in-time erase" (JiTE) erase policy. In a JiTE erase policy, erased blocks are randomly selected to be programmed, and the time between an erase operation and a program operation for a given block is random. Another example of a non-zero delay erase policy is an "erase in advance" (EIA) erase policy. In an EIA erase policy, erased blocks can be systematically selected to be programmed, and the erase-to-program delay for a given block is roughly similar to that of other blocks with a first-in-first out (FIFO) selection process (e.g., the blocks which have been erased for the longest time are the blocks which are programmed first). An EIA erase policy can guarantee a minimum amount of time between an erase operation and a subsequent program operation with respect to each block, whereas there is no such minimum in a JiTE erase policy (e.g., due to the random selection operation in a JiTE erase policy).

The implementation of an erase-to-program delay can result in a data retention improvement for the block, assuming that the erase-to-program delay is sufficiently long. For example, the erase-to-program delay can increase erase state (e.g., erase logical level) stability by reducing erase state charge gain and/or high-level data retention by reducing lateral charge migration between adjacent cells. Moreover, any data retention improvement that is achieved can subsequently be reduced or eliminated if a very short erase-to-program delay is implemented (i.e., fast block refreshes).

However, $V_T$ of cells can increase due to the discharge of residual holes that were trapped within the wordline after performing the erase operation. In other words, $V_T$ shift can increase as a function of the duration of the erase-to-program delay. In some instances, this $V_T$ shift can cause a further reduction of the RWB following a program operation, which can be further exaggerated with subsequent program/erase cycles. Accordingly, although a block may have improved data retention due to the erase-to-program delay of introduced as part of a non-zero delay erase policy, too high of an erase-to-program delay may lead to increased read errors due to reduced RWB.

Aspects of the present disclosure address the above and other deficiencies by controlling erase-to-program delay for improving data retention. Implementations described herein provide for a way to efficiently predict whether an erase-to-program delay would be sufficient to achieve a data retention improvement. Accordingly, implementations described herein can be used to determine an optimal erase-to-program delay that can achieve a data retention improvement while minimizing the drawbacks resulting from increasing erase-to-program delay (e.g., reduced RWB). Implementations described herein track erase-to-program delay, as opposed to post-programming delay, so that checking will be performed on an erased block instead of a programmed block. For example, implementations described herein can be applied during a baking process during which the memory device is placed in an environment having a particular temperature for a length of time.

To control an erase-to-program delay, a controller of a memory device can, after erasing a block, cause a set of cells addressable by a target wordline of the block to be programmed to a target $V_T$. The erase and program operations can be performed in accordance with a non-zero delay erase policy (e.g., JiTE or EIA). In some implementations, the target wordline is randomly selected by the controller. In some implementations, the target wordline is not randomly selected (i.e., predetermined). For example, an identifier of the target wordline can be preprogrammed for selection by the controller. In some implementations, the target wordline is an active wordline connected to a set of active data cells for storing active data to be readout during a read operation. The data cells can be of any suitable type, such as SLC MLC, TLC, QLC, etc. In some implementations, the target wordline is a dummy wordline connected to a set of dummy cells that are not used for storing active data. A dummy wordline can be used to track timing during read operations.

More specifically, to achieve the target $V_T$, the set of cells can be programmed by applying a programming pulse with a certain programming voltage to the target wordline. The programming voltage can have a magnitude that, when applied to the target wordline, causes a data pattern to be generated that defines a target wordline activation energy. The target wordline activation energy can be similar to the activation energy that is predetermined to enable the data retention improvement described above.

After programming the set of cells, the controller can then determine an amount of $V_T$ shift after a delay. Determining the amount of $V_T$ shift after the delay can include performing a scan operation with respect to the target wordline. Accordingly, the delay can represent the periodicity of the scan operation. The delay can have any suitable length. For example, the periodicity of the scan operation can be selected to balance scan operation frequency with accuracy (i.e., a balance of coarseness/fineness in granularity).

The scan operation can utilize any suitable technique for tracking $V_T$ shift with respect to a wordline. For example, determining the amount of $V_T$ shift can include comparing a target bit pattern against an expected bit pattern with a set of read voltages, determining when a threshold number of bits of the target bit pattern are correct (e.g., at least half of the bits of the target bit pattern are correct), recording the corresponding voltage as a current $V_T$, and comparing current $V_T$ to a previously recorded $V_T$ to determine the amount of $V_T$ shift.

The controller can then determine whether the amount of $V_T$ shift is sufficient to guarantee a target data retention improvement. More specifically, the controller can determine whether the amount of $V_T$ shift satisfies a threshold condition, e.g., determine whether the amount of $V_T$ shift is greater than or equal to a minimum amount of $V_T$ shift. The minimum amount of $V_T$ shift is an amount of $V_T$ shift that is determined to guarantee the target data retention improvement. The target data retention improvement can be represented by a target metric, which can reflect the target increase in RWB (e.g., in V).

Relationships between amounts of $V_T$ shifts and resulting data retention improvements can be empirically determined through experimentation, which can be used by a product engineer to determine respective translations between amounts of $V_T$ shifts and respective metrics indicative of data retention improvements. In some embodiments, translations between amounts of $V_T$ shift and respective metrics indicative of data retention improvements (e.g., increases in RWB) can be stored in a data structure accessible by the controller. For example, the data structure can be a lookup table. Thus, the controller can identify, from the data structure, the metric indicative of the data retention improvement assigned to the amount of $V_T$ shift, compare the metric identified from the data structure to the target metric, and determine whether the amount of $V_T$ shift is sufficient by determining whether the metric identified from the data structure is greater than or equal to the target metric.

In some embodiments, translations between amount of $V_T$ shift and respective metrics indicative of data retention improvements can be determined using a function. The controller can use the function to determine, for an input amount of $V_T$ shift, an output metric indicative of the data retention improvement, and determine whether the output metric is greater than or equal to the target metric. For example, output metric can be proportional to the input amount of $V_T$ shift (i.e., A~mX where A is the output metric, X is the input amount of $V_T$ shift and m is a scaling factor).

If the amount of $V_T$ shift is determined to be sufficient (e.g., the metric identified from the data structure is greater than or equal to the target metric), this means that the chosen erase-to-program delay is sufficiently long. Thus, the controller can release the block for programming. For example, the controller can add the block to a list of candidate blocks for programming. If the amount of $V_T$ shift is determined to be insufficient (e.g., the metric identified from the data structure is less than the target metric), then the controller can, after the delay, repeat the process of determining an amount of $V_T$ shift to obtain an updated amount of $V_T$ shift (e.g., perform another scan operation with respect to the target wordline). The controller can perform a similar process to determine whether the updated amount of $V_T$ shift is sufficient to guarantee the target data retention improvement. Further details regarding controlling erase-to-program delay for data retention will be described below with reference to FIGS. 1A-6.

Advantages of the present disclosure include, but are not limited to, improved memory device performance and reliability. For example, embodiments described herein can achieve improved erase state stability data retention for low latency applications while minimizing undesirable $V_T$ shift and read errors. Accordingly, embodiments described herein can be used to increase the lifespan of a memory device.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to program data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes erase-to-program delay (EPD) component 113 that can control erase-to-program delay for data retention. In some embodiments, the memory sub-system controller 115 includes at least a portion of the EPD component 113. In some embodiments, the EPD component 113 is part of the host system 120, an application, or an operating system. In other embodiments, local media controller 135 includes at least a portion of EPD component 113 and is configured to perform the functionality described herein.

The EPD component 113 can obtain an erased block of a memory array of the memory device 130, and can cause a set of cells addressable by a target wordline of the erased block to be programmed in accordance with a non-zero delay erase policy. In some embodiments, obtaining the erased block includes causing a block of the memory array to be erased. In some embodiments, the block is randomly selected. For example, the block can be selected in accordance with a JiTE erase policy. An example of a JiTE erase policy will be described in further detail below with reference to FIG. 4. In some embodiments, the block is selected in accordance with a first-in first-out (FIFO) policy. For example, the block can be selected in accordance with an EIA erase policy. An example of an EIA erase policy will be described in further detail below with reference to FIG. 5. Causing the set of cells to be programmed can include causing a programming pulse to be applied to the target wordline with a programming voltage to the target wordline. The programming voltage can have a magnitude that, when applied to the target wordline, causes a data pattern to be generated that defines a target wordline activation energy.

In some implementations, the target wordline is randomly selected by the EPD component 113. In some implementations, the target wordline is not randomly selected by the EPD component 113 (e.g., an identifier of the target wordline is preprogrammed for selection by the EDP component 113). In some implementations, the target wordline is an active wordline connected to a set of active data cells for storing data to be readout during a read operation. The data cells can be of any suitable type, such as SLC MLC, TLC, QLC, etc. In some implementations, the target wordline is a dummy wordline connected to a set of dummy cells for storing dummy data.

The EPD component 113 can determine an amount of $V_T$ shift after the delay. For example, the delay can be a predefined idle time. In some embodiments, determining the amount of $V_T$ shift includes causing a scan operation to be performed with respect to the target wordline after the delay. The scan operation can be any suitable scan operation for tracking $V_T$ shift with respect to a wordline. Accordingly, the delay represents the periodicity of the scan operation. The delay can have any suitable length or granularity. In some embodiments, the delay is on the order of hours. The amount of $V_T$ shift can reflect a metric indicative of a data retention improvement.

The EPD component 113 can determine whether the amount of $V_T$ shift is sufficient. For example, processing logic can determine whether the amount of $V_T$ shift satisfies a threshold condition. Determining whether the amount of $V_T$ shift satisfies the threshold condition can include determining whether the amount of $V_T$ shift is greater than or equal to a minimum amount of $V_T$ shift. The minimum amount of $V_T$ shift is an amount of $V_T$ shift that is determined to guarantee a target data retention improvement. The target data retention improvement can be represented by a target metric indicative of the target data retention improvement. In some embodiments, the target metric is a target increase in RWB (e.g., in V). Relationships between amounts of $V_T$ shifts and resulting data retention improvements can be empirically determined, which can be used to determine respective translations between amounts of $V_T$ shifts and respective metrics indicative of data retention improvements. Accordingly, determining whether the amount of threshold voltage shift is sufficient can include comparing the metric to a target metric indicative of the data retention improvement.

In some embodiments, translations between amounts of $V_T$ shift and respective metrics indicative of data retention improvements (e.g., increases in RWB) can be stored in a data structure accessible by the EPD component 113 (e.g., within the local media controller 135). For example, the data structure can be a lookup table. Thus, the EPD component 113 can use the data structure to identify the metric indicative of the data retention improvement corresponding to the amount of $V_T$ shift, compare the metric identified from the data structure to the target metric, and determine whether the amount of $V_T$ shift is sufficient by determining whether the metric identified from the data structure is greater than or equal to the target metric.

In some embodiments, translations between amount of $V_T$ shift and respective metrics indicative of data retention improvements can be determined using a function. The EPD component 113 can use the function to determine, for an input amount of $V_T$ shift, an output metric indicative of the data retention improvement, and determine whether the output metric is greater than or equal to the target metric. For example, output metric can be proportional to the input amount of $V_T$ shift (i.e., A~mX where A is the output metric, X is the input amount of $V_T$ shift and m is a scaling factor).

If the amount of $V_T$ shift is determined to be sufficient (e.g., the metric identified from the data structure is greater than or equal to the target metric), this means that the erase-to-program delay is sufficiently long. Thus, the EPD component 113 can release the erased block for programming. For example, EPD component 113 can cause the erased block to be released for programming. In some embodiments, causing the erased block to be released for programming includes adding the erased block to a list of candidate blocks for programming. If the amount of $V_T$ shift is determined to be insufficient (e.g., the metric identified from the data structure is less than the target metric), then the EPD component 113 can determine an updated amount of $V_T$ shift. Further details with regards to the operations of the EPD component 113 will be described below with reference to FIGS. 1B-5.

Figure 1B:
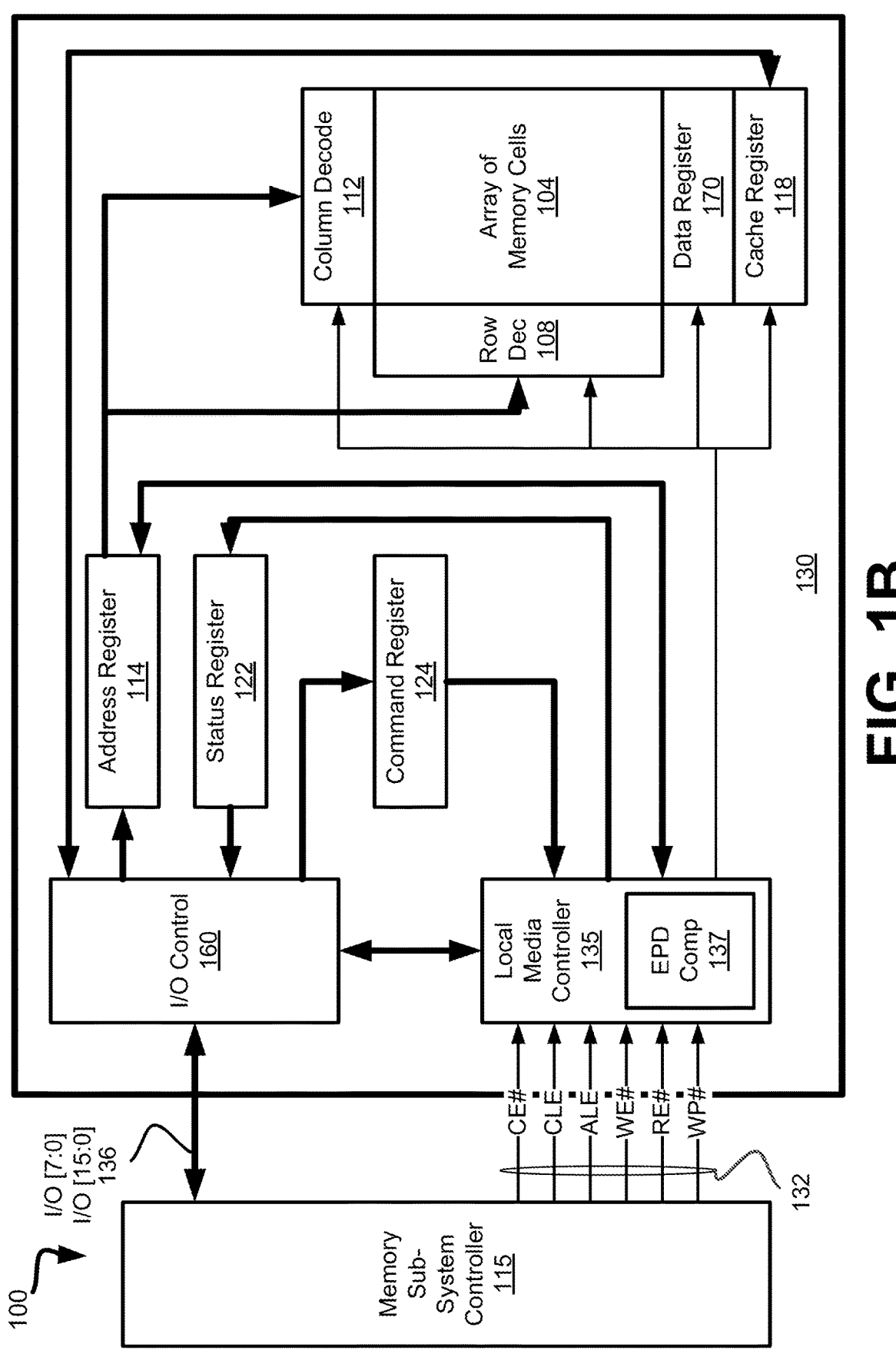
FIG. 1B illustrates an example block diagram of a memory device in communication with a memory sub-system controller of a memory sub-system, in accordance with some embodiments of the present disclosure.

FIG. 1B illustrates an example simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device. The memory sub-system controller 115 can include the adaptive erase component 113.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, program operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data can be passed from the cache register 172 to the data register 170 for transfer to the array of memory cells 104; then new data can be latched in the cache register 172 from the I/O control circuitry 160. During a read operation, data can be passed from the cache register 172 to the I/O control circuitry 160 for output to the memory sub-system controller 115; then new data can be passed from the data register 170 to the cache register 172. The cache register 172 and/or the data register 170 can form (e.g., can form a portion of) a page buffer of the memory device 130. A page buffer can further include sensing devices (not shown in FIG. 1B) to sense a data state of a memory cell of the array of memory cells 104, e.g., by sensing a state of a data line connected to that memory cell. A status register 122 can be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory subsystem controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 160 and can then be written into command register 124. The addresses can be received over input/output (I/O) pins [7:0] of I/O bus 134 at I/O control circuitry 160 and can then be written into address register 114. The data can be received over input/output (I/O) pins [7:0] for an 8-bit device or input/output (I/O) pins [15:0] for a 16-bit device at I/O control circuitry 160 and then can be written into cache register 172. The data can be subsequently written into data register 170 for programming the array of memory cells 104.

In an embodiment, cache register 172 can be omitted, and the data can be written directly into data register 170. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B can not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
FIGS. 2A-2C are diagrams of portions of an example array of memory cells included in a memory device, in accordance with some embodiments of the present disclosure.
Figure 2B:
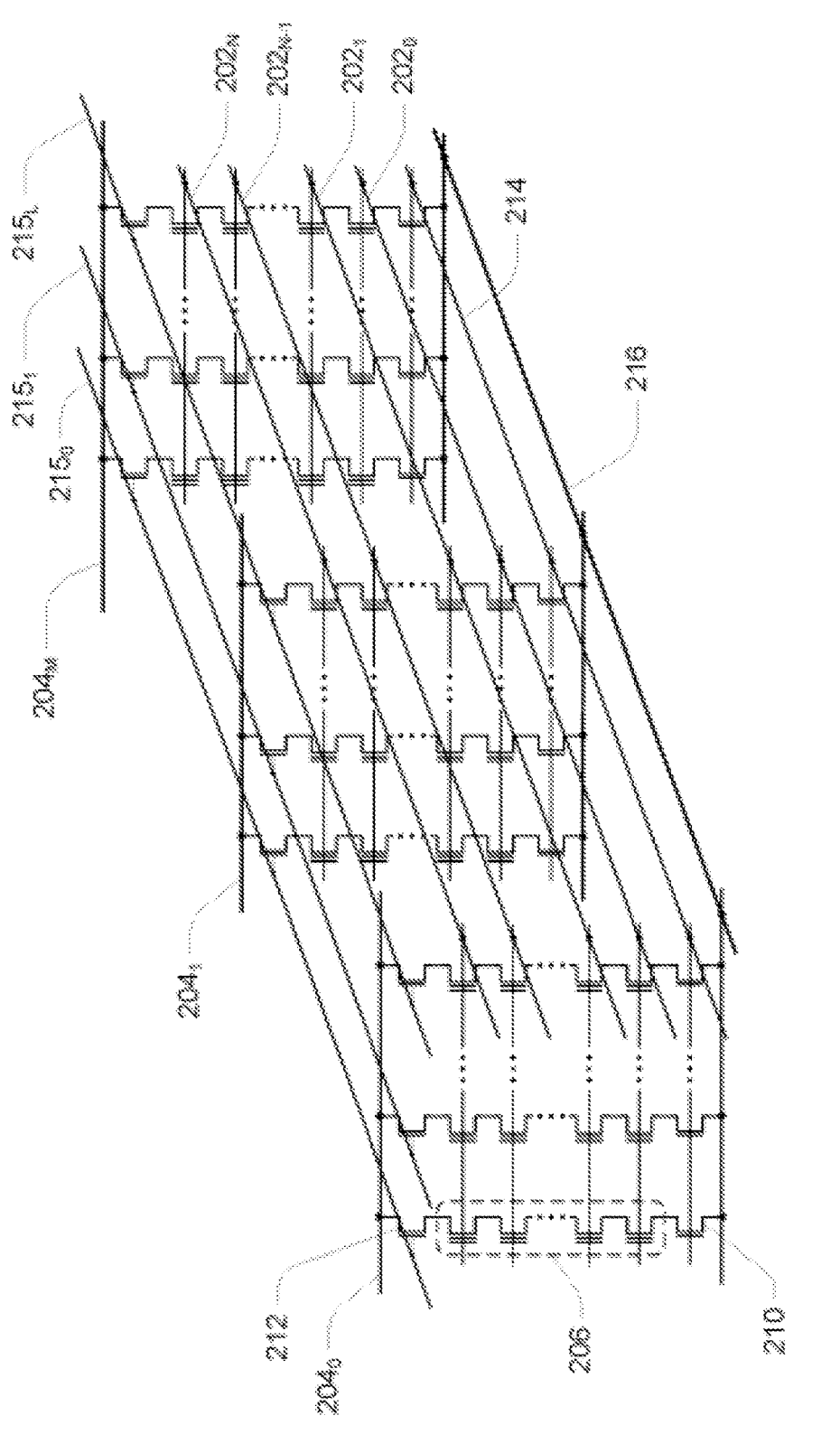
Figure 2C:
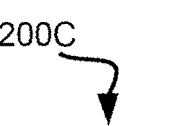

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly addressable by a given wordline 202. For example, memory cells 208 commonly addressable by wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly addressable by wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly addressable by a given wordline 202 may also define a physical page of memory cells 208. For certain memory devices, all memory cells commonly addressable by a given wordline might be deemed a physical page of memory cells. The portion of a physical page of memory cells (which, in some embodiments, could still be the entire row) that is read during a single read operation or programmed during a single program operation (e.g., an upper or lower page of memory cells) might be deemed a logical page of memory cells. A block of memory cells may include those memory cells that are configured to be erased together, such as all memory cells addressable by wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Groups of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly addressable by each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) 238 represent the channel regions of different strings of series-connected memory cells (e.g., strings 206 of FIGS. 2A-2B) selectively connected to the bitline $204_0$ and/or bitline $204_1$. A memory cell (not depicted in FIG. 2C) may be formed at each intersection of a wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, blocked channel regions with interposed conductive regions, etc.

Figure 3:
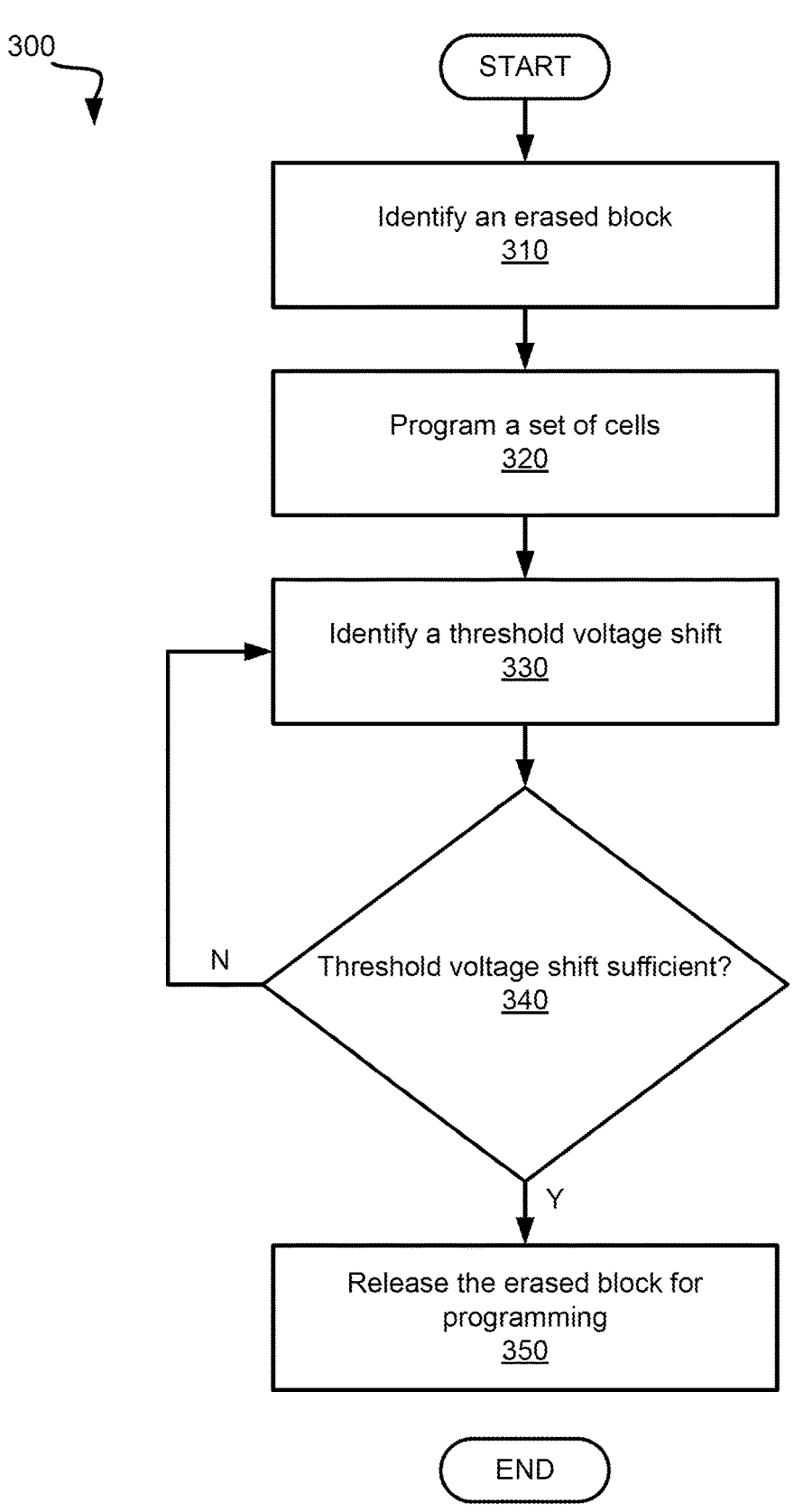
FIG. 3 is a flow diagram of an example method to control erase-to-program delay for data retention, in accordance with some embodiments of the present disclosure.

FIG. 3 illustrates a flow diagram of an example method 300 to control erase-to-program delay for data retention, in accordance with some embodiments of the present disclosure. The method 300 described with respect to FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the EPD component 113 of FIG. 1A-B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, an erased block is identified and, at operation 320, a set of cells is programmed. For example, processing logic at operation 310 can obtain an identifier of an erased block of a memory array of a memory device, and processing logic at operation 320 can cause a set of cells addressable by a target wordline of the erased block to be programmed to a target threshold voltage. Causing the set of cells to be programmed can include causing a programming pulse to be applied to the target wordline with a programming voltage to the target wordline. The programming voltage can have a magnitude that, when applied to the target wordline, causes a data pattern to be generated that defines a target wordline activation energy. In some implementations, the target wordline is randomly selected. In some implementations, the target wordline is predetermined (e.g., preassigned). In some implementations, the target wordline is an active wordline connected to a set of active data cells for storing data to be readout during a read operation. The data cells can be of any suitable type, such as SLC MLC, TLC, QLC, etc. In some implementations, the target wordline is a dummy wordline connected to a set of dummy cells for storing dummy data. In some embodiments, the erased block is erased and the set of cells is programmed in accordance with a non-zero delay erase policy. In some embodiments, the non-zero delay erase policy is a JiTE erase policy. An example of a JiTE erase policy will be described in further detail below with reference to FIG. 4. In some embodiments, the non-zero delay erase policy is an EIA erase policy. An example of an EIA erase policy will be described in further detail below with reference to FIG. 5.

At operation 330, an amount of threshold voltage shift is identified. For example, processing logic can determine the amount of threshold voltage shift with respect to the target threshold voltage after a delay. For example, the delay can be a predefined idle time. In some embodiments, determining the threshold voltage shift includes causing a scan operation to be performed with respect to the target wordline after the delay. The scan operation can be any suitable scan operation for tracking threshold voltage shift with respect to a wordline. Accordingly, the delay can represent the periodicity of the scan operation. The delay can have any suitable length or granularity.

At operation 340, it is determined whether the amount of threshold voltage shift is sufficient. For example, processing logic can determine whether the amount of threshold voltage shift satisfies a threshold condition defined by a target data retention metric. In some embodiments, the target data retention metric is a target increase in RWB (e.g., in V). More specifically, the amount of threshold voltage shift can be translated into a data retention metric reflecting an improvement to data retention. Determining whether the amount of threshold voltage shift satisfies the threshold condition can include determining whether the amount of threshold voltage shift is greater than or equal to a minimum amount of threshold voltage shift. The minimum amount of threshold voltage shift is an amount of threshold voltage shift that translates into the target data retention metric. Relationships between amounts of threshold voltage shifts and data retention metrics can be empirically determined, which can be used to determine respective translations between amounts of threshold voltage shifts and respective metrics indicative of data retention improvements. In some embodiments, translations between amounts of threshold voltage shift and respective data retention metrics can be stored in a data structure. For example, the data structure can be a lookup table. Thus, processing logic can use the data structure to identify the data retention metric corresponding to the amount of threshold voltage shift, and determine whether the amount of threshold voltage shift satisfies the threshold condition by determining whether the data retention metric identified from the data structure is greater than or equal to the target data retention metric. In some embodiments, translations between amount of threshold voltage shift and respective metrics indicative of data retention improvements can be determined using a function. The function can be used to determine, for the amount of threshold voltage shift, the data retention metric corresponding to the amount of threshold voltage shift, and determine whether the data retention metric determined from the function is greater than or equal to the target metric. For example, data retention metric can be proportional to the amount of threshold voltage shift (i.e., A~mX where A is the output metric, X is the input amount of threshold voltage shift and m is a scaling factor).

If the amount of threshold voltage shift is sufficient (e.g., the amount of threshold voltage shift satisfies the threshold condition defined by the target data retention metric), this means that the erase-to-program delay is sufficiently long. Thus, processing logic can, at operation 350, release the erased block for programming. For example, processing logic can cause the erased block to be released for programming. In some embodiments, causing the erased block to be released for programming includes adding the erased block to a list of candidate blocks for programming. If the amount of threshold voltage shift is insufficient (e.g., the amount of threshold voltage shift does not satisfy the threshold condition defined by the target data retention metric), then the process can revert back to operation 330 to identify an updated amount of threshold voltage shift. Further details regarding operations 310-350 are described above with reference to FIG. 1A and will be described in further detail below with reference to FIGS. 4-5.

Figure 4:
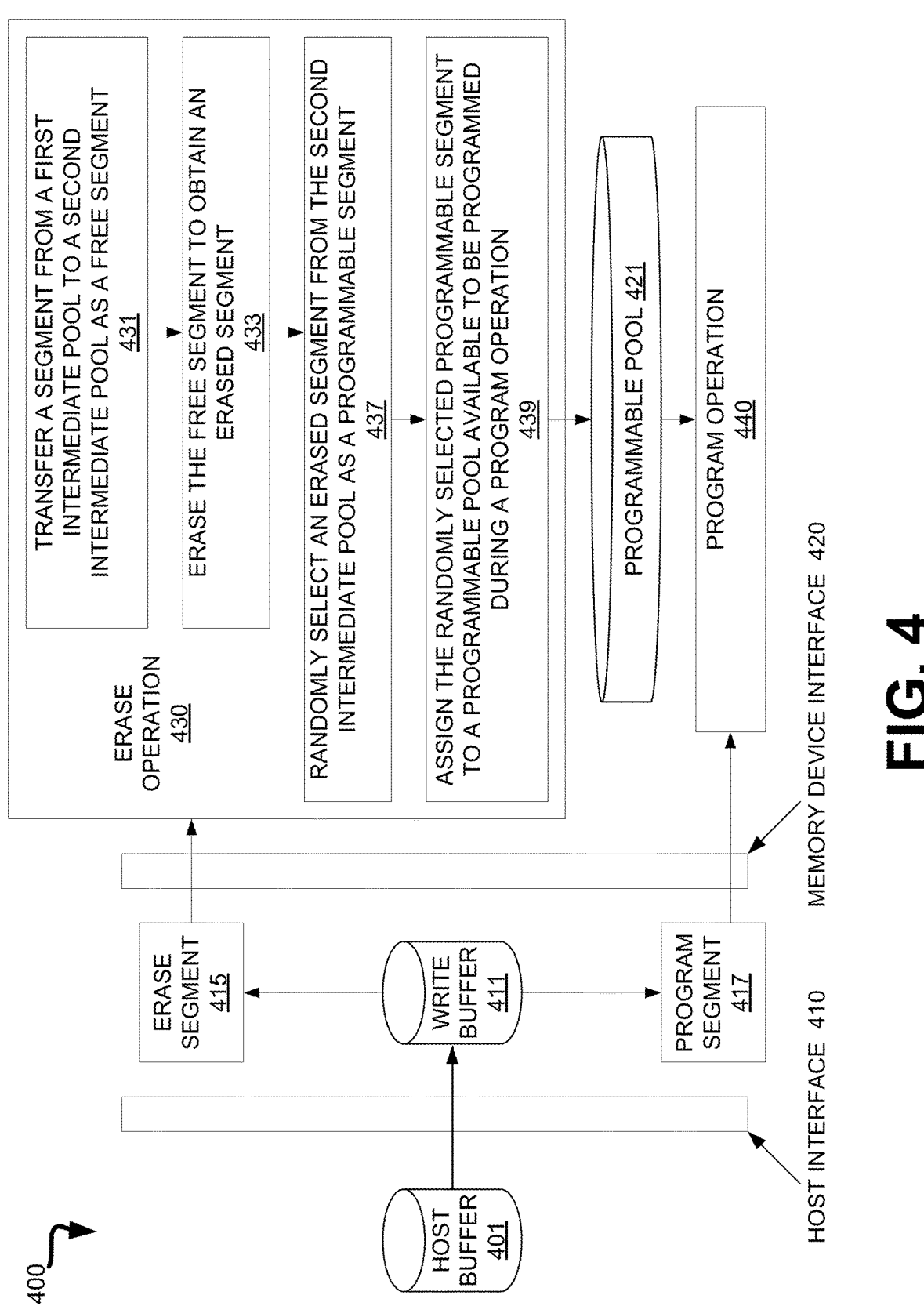
FIGS. 4-5 illustrate example systems for applying a non-zero delay erase policy, in accordance with some embodiments of the present disclosure.

FIG. 4 illustrates an example system 400 implementing a non-zero delay erase policy, in accordance with some embodiments. For example, the system 400 can implement a JiTE erase policy. In some embodiments, system 400 can be a memory sub-system, such as memory subsystem 110 as described with respect to FIGS. 1A-B. In some embodiments, system 400 can implement method 300 described with respect to FIG. 3.

The system 400 includes host buffer 401 of a host system (e.g., the host system 120 of FIG. 1A) and a buffer 411 of a memory sub-system (e.g., the memory sub-system 110 of FIG. 1A). Program buffer 411 stores program requests received from host buffer 401. A memory sub-system controller (e.g., memory sub-system controller 115 of FIGS. 1A-1B) can send, via a memory interface device 420, an erase block command to erase the block at operation 415. More specifically, the erase block command can be a command to initiate or continue an erase operation 430 to erase the block. The memory sub-system controller can send, via the memory interface device 420, a program block command to program the block at operation 417. More specifically, the program block command can be a command to initiate or continue a program operation to program the block. In some embodiments, operations 415, and 417, can be performed serially or in parallel.

A controller (e.g., the local media controller 135 of FIGS. 1A-1B) can receive the erase block command to perform the erase operation 430 and/or the program block command to perform the program operation 440. To perform the erase operation 430, the controller can select the block to erase. To perform the program operation 440, the controller can select the block to program. In many embodiments, the erase operation 430 can prepare the block to be programmed with new data during the program operation 440.

Erase operation 430 can include sub-operations, such as sub-operations 431, 433, 437, and 439 shown here. At sub-operation 431, the controller transfers the block from a first intermediate pool to a second intermediate pool as a free block. In some embodiments, the first intermediate pool can be a garbage pool. The assignment of the block to the garbage pool can indicate that the block can be programmed. In some embodiments, the second intermediate pool can be a free pool. The assignment of the block to the free pool can indicate that the block can be programmed. In some embodiments, assigning the block to the first intermediate pool can include reassigning the block from the garbage pool to another intermediate pool. In some embodiments, the controller can assign a block to two or more intermediate pools before the block can be programmed.

At sub-operation 433, processing logic erases the block in the second intermediate pool to obtain an erased block. In some embodiments, the block can be erased by setting the cells in the block to an erase voltage level or set of erase voltage levels. In some embodiments, the controller can assign an erase voltage as a "high" voltage for the cells in the block. In some embodiments, the local media controller can erase a block by assigning the block to an intermediate pool (e.g., the first intermediate pool of 431 or the second intermediate pool of 431, etc.).

At sub-operation 437, the controller randomly selects a block from the second intermediate pool as a programmable block. In some embodiments, processing logic might not track the amount of time a block has been in an intermediate pool (e.g., the first and/or second intermediate pools of sub-operations 433 and 437). In some embodiments, by selecting a block from an intermediate pool (e.g., the free pool of sub-operations 433 and 437), the processing logic is indicating that the block can be programmed.

At sub-operation 439, the controller assigns the randomly selected programmable block to a programmable pool available to be programmed during a program operation. In some embodiments, the programmable pool can be programmable pool 421. In some embodiments, the controller can assign erased blocks to programmable pool 421. In some embodiments, programmable pool 421 can include fully erased blocks. In some embodiments, by assigning the erased block to programmable pool 421, the processing logic is indicating that the block can be programmed.

To perform the program operation, the controller causes an erased block to be programmed at operation 440. In some embodiments, processing logic can select the erased block to be programmed from programmable pool 421. In some embodiments, processing logic can select the programmable block from programmable pool 421 to be programmed. In some embodiments, the controller can program a block whose cells have not been reset to a uniform erase voltage level (e.g., an erase voltage or erase state). In some embodiments, there can be a delay between removing the block from the programmable pool and programming the block. In some embodiments, the controller can apply a delay before programming the block from programmable pool 421.

Figure 5:
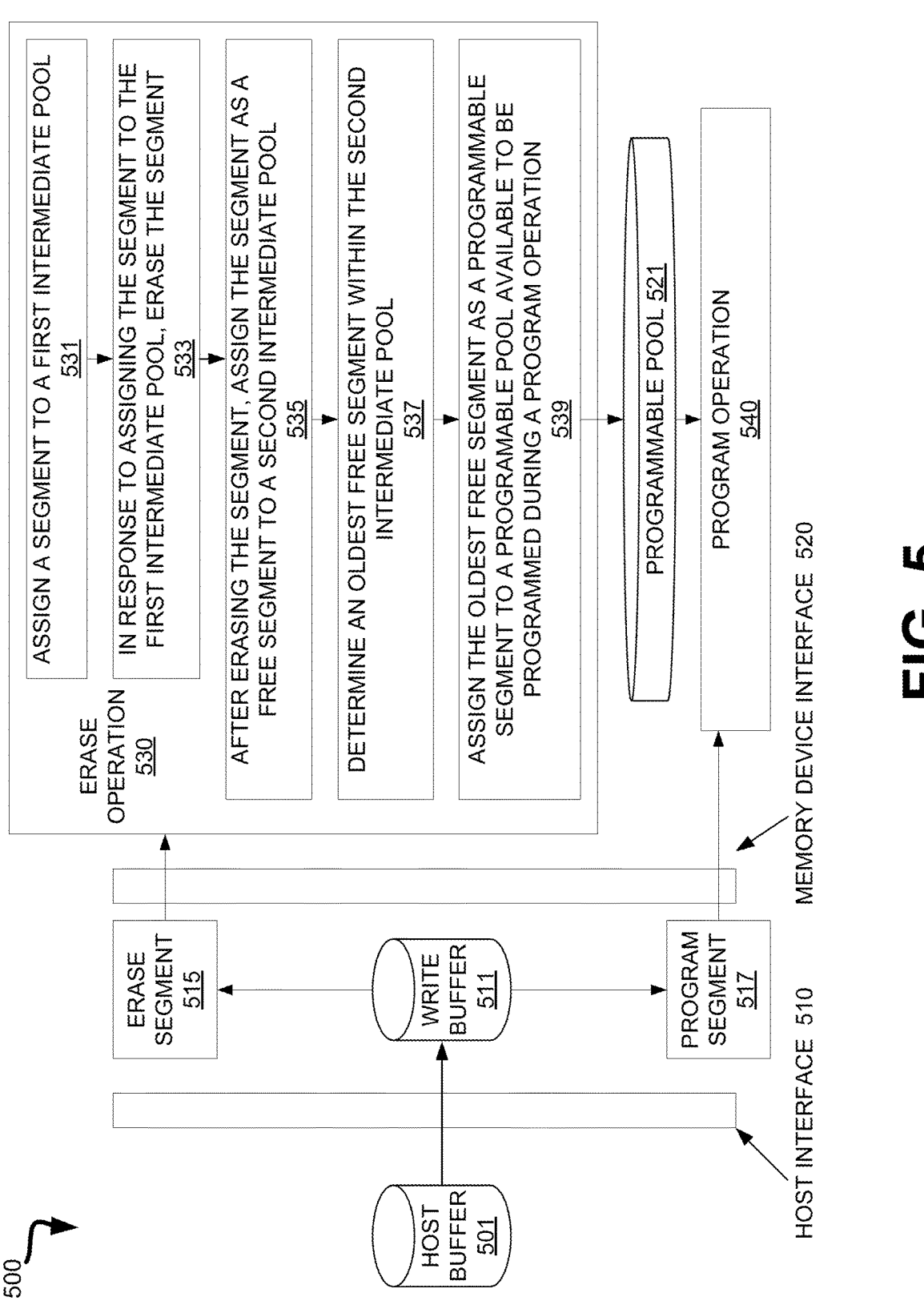

FIG. 5 illustrates an example system 500 implementing a non-zero delay erase policy, in accordance with some embodiments. For example, the system 500 can implement an EIA erase policy. In some embodiments, system 500 can be a memory subsystem such as memory sub-system 110 as described with respect to FIGS. 1A-B. In many embodiments, system 500 can implement method 300 as described with respect to FIG. 3.

The system 500 includes host buffer 501 of a host system (e.g., the host system 120 of FIG. 1A) and a buffer 411 of a memory sub-system (e.g., the memory sub-system 110 of FIG. 1A). Program buffer 511 stores program requests received from host buffer 501. A memory sub-system controller (e.g., memory sub-system controller 115 of FIGS. 1A-1B) can send, via a memory interface device 520, an erase block command to erase the block at operation 515. More specifically, the erase block command can be a command to initiate or continue an erase operation 530 to erase the block. The memory sub-system controller can send, via the memory interface device 420, a program block command to program the block at operation 517. More specifically, the program block command can be a command to initiate or continue a program operation to program the block. In some embodiments, operations 515, and 517, can be performed serially or in parallel.

A controller (e.g., the local media controller 135 of FIGS. 1A-1B) can receive the erase block command to perform the erase operation 530 and/or the program block command to perform the program operation 540. To perform the erase operation 530, the controller can select the block to erase. To perform the program operation 540, the controller can select the block to program. In some embodiments, the erase operation 530 can prepare the block to be programmed with new data during the program operation 440.

Erase operation 530 can include sub-operations, such as sub-operations 531, 533, 537, and 539 shown here. At sub-operation 531, the controller assigns the block to a first intermediate pool. In some embodiments, the first intermediate pool can be a garbage pool. The assignment of the block to the garbage pool can indicate that the block can be programmed. In some embodiments, assigning the block to the first intermediate pool can include reassigning the block from the garbage pool to another intermediate pool. In some embodiments, the controller can assign a block to two or more intermediate pools before the block can be programmed.

At sub-operation 533, in response to assigning the block to the first intermediate pool, processing logic erases the block to obtain an erased block. In some embodiments, the block can be erased by setting the cells in the block to an erase voltage level or set of erase voltage levels. In some embodiments, the controller can assign an erase voltage as a "high" voltage for the cells in the block. In some embodiments, the controller can erase a block by assigning the block to an intermediate pool (e.g., the first intermediate pool of 531, etc.).

At sub-operation 535, after erasing the block, the controller assigns the block as a free block to a second intermediate pool. In some embodiments, the second intermediate pool can be a free pool. The assignment of the block to the free pool can indicate that the block can be programmed. In some embodiments, assigning the block to the second intermediate pool can include reassigning the block from the free pool to another intermediate pool. In some embodiments, assignment as a free block can indicate the block can be programmed.

At sub-operation 537, processing logic determines an oldest block in the second intermediate pool. In some embodiments, processing logic can determine an oldest block in a free pool. In some embodiments, by selecting a block from an intermediate pool (e.g., the garbage pool of sub-operation 531, or the free pool of sub-operations 535), the processing logic is indicating that the block can be programmed.

At sub-operation 539, the controller assigns the oldest free block as a programmable block to a programmable pool available to be programmed during a program operation. In some embodiments, the programmable pool can be programmable pool 521. In some embodiments, the controller can assign erased blocks to programmable pool 521 in order (e.g., first-in-first-out (FIFO)). In some embodiments, programmable pool 521 can include fully erased blocks. In some embodiments, by assigning the oldest free block to programmable pool 521, the processing logic is indicating that the block can be programmed.

To perform the program operation, the controller causes an erased block to be programmed at operation 540. In some embodiments, the controller can select the erased block to be programmed from programmable pool 421. In some embodiments, the controller can select the programmable block from programmable pool 521 to be programmed. In some embodiments, the controller can program a block whose cells have not been reset to a uniform erase voltage level (e.g., an erase voltage or erase state). In some embodiments, there can be a delay between removing the block from the programmable pool and programming the block. In some embodiments, the controller can apply a delay before programming the block from programmable pool 521.

Figure 6:
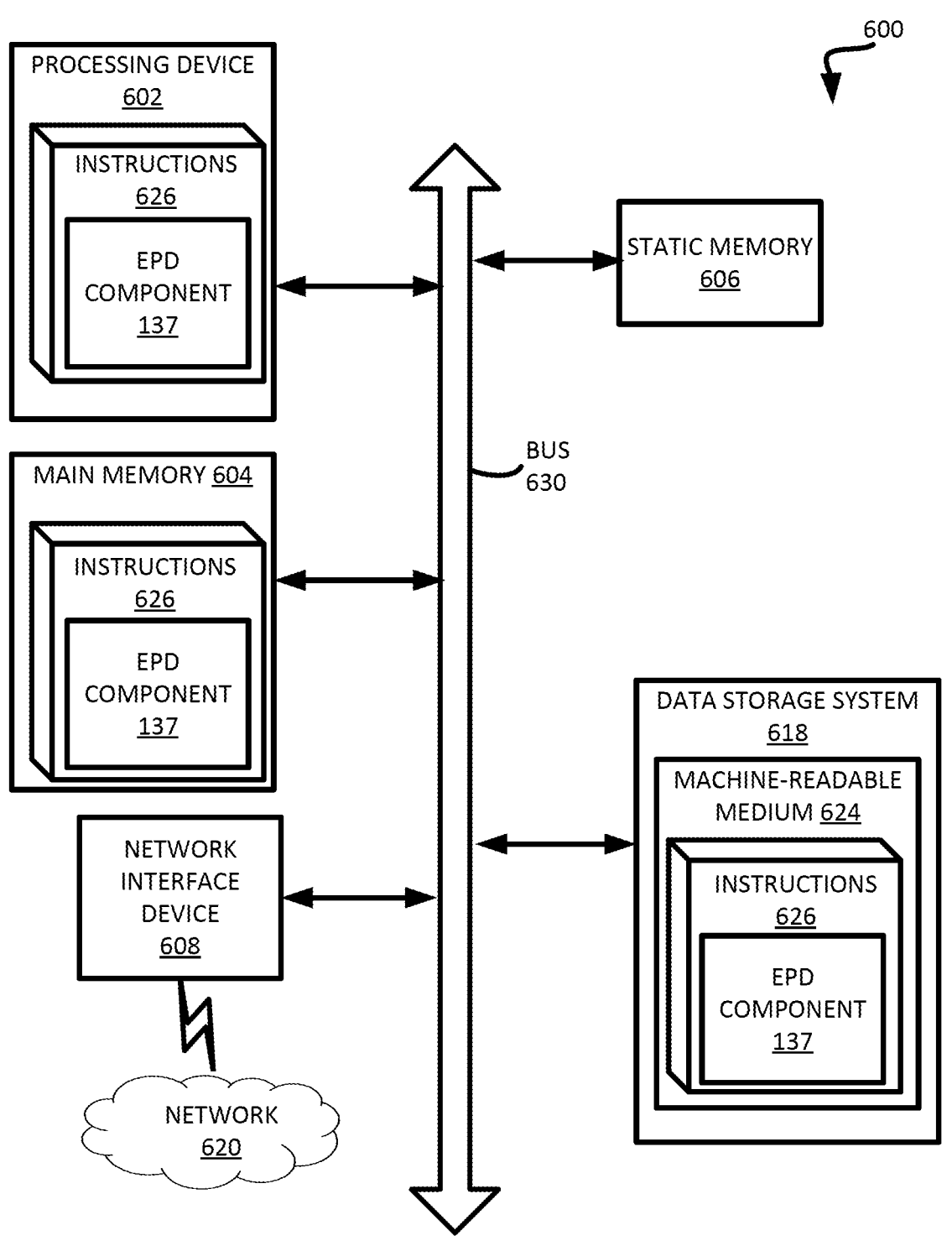
FIG. 6 illustrates an example block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the EPD component 113 of FIGS. 1A-B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 804 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1A.

In one embodiment, the instructions 626 include instructions to implement functionality corresponding to an EPD component (e.g., the EPD component 113 of FIGS. 1A-B). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled to the memory array, to perform operations comprising:
identifying an erased block of the memory array;
causing, at a first time, a set of cells addressable by a target wordline of the erased block to be programmed to a target threshold voltage different from an erase state;
determining an amount of threshold voltage shift with respect to the target threshold voltage at a second time after the first time, wherein a difference between the second time and the first time is defined by a delay;
determining whether the amount of threshold voltage shift satisfies a threshold condition defined by a target data retention metric; and
in response to determining that the amount of threshold voltage shift is sufficient, releasing the erased block for programming.

2. The memory device of claim 1, wherein the erased block is erased and the set of cells is programmed in accordance with a non-zero delay erase policy.

3. The memory device of claim 1, wherein the amount of threshold voltage shift corresponds to a data retention metric determined using a lookup table.

4. The memory device of claim 1, wherein the amount of threshold voltage shift corresponds to a data retention metric determined using a function.

5. The memory device of claim 1, wherein causing the set of cells to be programmed comprises causing a programming pulse to be applied to the target wordline with a programming voltage to generate a data pattern that defines a target wordline activation energy.

6. The memory device of claim 1, wherein determining the amount of threshold voltage shift comprises causing a scan operation to be performed with respect to the target wordline.

7. The memory device of claim 1, wherein the operations further comprise: in response to determining that the amount of threshold voltage shift does not satisfy the threshold condition, re-determining the amount of threshold voltage shift after the delay.

8. A method comprising:
identifying, by a processing device, an erased block of a memory device;
causing, by the processing device at a first time, a set of cells addressable by a target wordline of the erased block to be programmed to a target threshold voltage different from an erase state;
determining, by the processing device, an amount of threshold voltage shift with respect to the target threshold voltage at a second time after the first time, wherein a difference between the second time and the first time is defined by a delay;
determining, by the processing device, whether the amount of threshold voltage shift satisfies a threshold condition defined by a target data retention metric; and
in response to determining that the amount of threshold voltage shift is sufficient, releasing, by the processing device, the erased block for programming.

9. The method of claim 8, wherein the erased block is erased and the set of cells is programmed in accordance with a non-zero delay erase policy.

10. The method of claim 8, wherein the amount of threshold voltage shift corresponds to a data retention metric determined using a lookup table.

11. The method of claim 8, wherein the amount of threshold voltage shift corresponds to a data retention metric determined using a function.

12. The method of claim 8, wherein causing the set of cells to be programmed comprises causing a programming pulse to be applied to the target wordline with a programming voltage to generate a data pattern that defines a target wordline activation energy.

13. The method of claim 8, wherein determining the amount of threshold voltage shift comprises causing a scan operation to be performed with respect to the target wordline.

14. The method of claim 8, further comprising: in response to determining that the amount of threshold voltage shift does not satisfy the threshold condition, re-determining, by the processing device, the amount of threshold voltage shift after the delay.

15. A non-transitory computer-readable storage medium comprising instructions that, when executed by a processing device, cause the processing device to perform operations comprising:
identifying an erased block of a memory array;
causing, at a first time, a set of cells addressable by a target wordline of the erased block to be programmed to a target threshold voltage different from an erase state;
determining an amount of threshold voltage shift with respect to the target threshold voltage at a second time after the first time, wherein a difference between the second time and the first time is defined by a delay;
determining whether the amount of threshold voltage shift satisfies a threshold condition defined by a target data retention metric; and
in response to determining that the amount of threshold voltage shift does not satisfy the threshold condition, re-determining the amount of threshold voltage shift after the delay.

16. The non-transitory computer-readable storage medium of claim 15, wherein the erased block is erased and the set of cells is programmed in accordance with a non-zero delay erase policy.

17. The non-transitory computer-readable storage medium of claim 15, wherein the amount of threshold voltage shift corresponds to a data retention metric determined using a lookup table.

18. The non-transitory computer-readable storage medium of claim 15, wherein the amount of threshold voltage shift corresponds to a data retention metric determined using a function.

19. The non-transitory computer-readable storage medium of claim 15, wherein causing the set of cells to be programmed comprises causing a programming pulse to be applied to the target wordline with a programming voltage to generate a data pattern that defines a target wordline activation energy.

20. The non-transitory computer-readable storage medium of claim 15, wherein the operations further comprise: in response to determining that the amount of threshold voltage shift satisfies the threshold condition, releasing the erased block for programming.

\* \* \* \* \*